(12) United States Patent
Matsuyama

(10) Patent No.: US 6,246,030 B1
(45) Date of Patent: Jun. 12, 2001

(54) HEAT PROCESSING METHOD AND APPARATUS

(75) Inventor: Yuji Matsuyama, Kumamoto-ken (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 09/357,552

(22) Filed: Jul. 20, 1999

(30) Foreign Application Priority Data

Jul. 22, 1998 (JP) .................................................. 10-223569

(51) Int. Cl.[7] ...................................................... F27B 5/14
(52) U.S. Cl. ........................ 219/390; 219/405; 392/416; 118/724
(58) Field of Search ..................................... 219/390, 405, 219/411; 392/416, 418; 118/724, 725, 50.1

(56) References Cited

U.S. PATENT DOCUMENTS 4,976,996 * 12/1990 Monkowski et al. ............. 427/255.5
5,479,874 * 1/1996 Correa ..................................... 117/84

* cited by examiner

*Primary Examiner*—Teresa Walberg
*Assistant Examiner*—Shawntina Fuqua
(74) *Attorney, Agent, or Firm*—Rader, Fishman & Grauer

(57) ABSTRACT

In a heat processing method for heating a wafer mounted on a base inside a process container to 120° C. with a heat generator buried inside the base, a gas pre-heated to 120° C. by a heater passes through the space above the wafer after being rectified so as to be parallel to the wafer by a rectifying board disposed near a supply vent. Thereby, temperature distribution in the space above the substrate is kept uniform during heat processing.

21 Claims, 12 Drawing Sheets

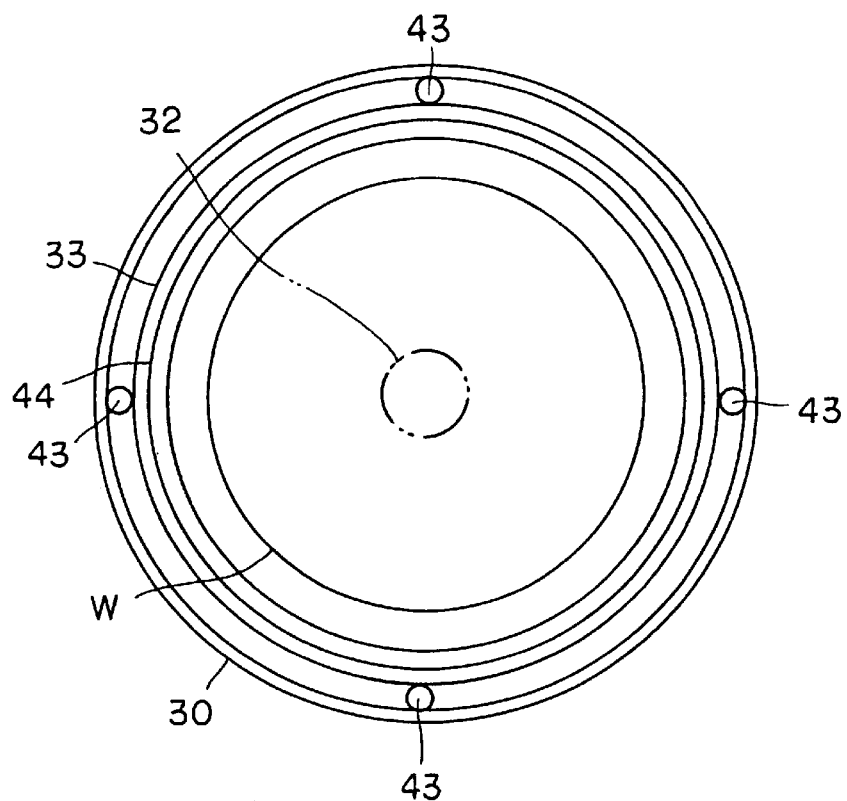
F I G. 5
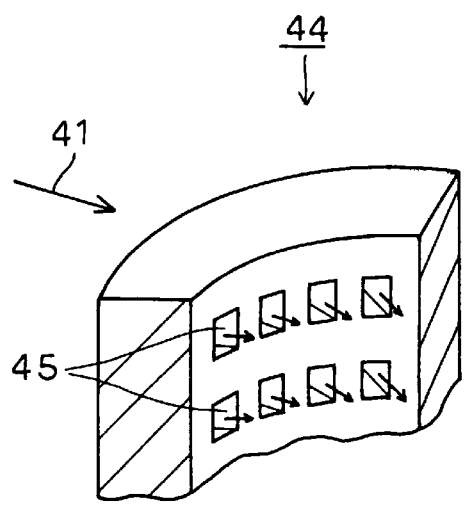
F I G. 6

HEAT PROCESSING METHOD AND APPARATUS

FIELD OF THE INVENTION

The present invention relates to a heat processing method and a heat processing apparatus for heating a substrate, such as an LCD substrate or a semiconductor wafer.

BACKGROUND OF THE INVENTION

Conventionally, in a process for manufacturing a semiconductor device, a series of processes is performed upon the surface of a substrate such as a semiconductor wafer (referred to as a 'wafer' hereinafter). That is, a circuit pattern is contracted and exposed upon a photo-resist formed on the substrate's surface using a photo-lithography technique, and then the substrate is developed.

During these coating and developing processes, a wafer is coated with a resist, exposed, and then developed. The wafer is heated (baked) before and after these processes, if necessary. Namely, there are performed so-called dehydration baking for drying the wafer, so-called pre-baking (PREBAKE) for heating and removing the resist solution included in the resist, so-called post-exposure baking (hereinafter referred to as 'PEB') performed between exposure and development, post-baking (POBEBAKE) performed after development, and so forth.

A heat processing apparatus performing such heat processing comprises a base disposed in a process container for mounting a wafer and a heat generator (such as a heater) buried inside the base. The heat generator heats to a high temperature (such as 120° C.) to heat the wafer. With the influence of this heat generator, the temperature around the base will also rise to approximately 120° C.

SUMMARY OF THE INVENTION

In a conventional heat processing apparatus, however, no special temperature adjusting means is disposed on the inner side or the ceiling of the process container. Therefore, temperature gradually drops from 120° C. as it gets farther away from the base and nearing the inner side and the ceiling of the process container, resulting in uneven temperature distribution of air inside the process container. Such unevenness of temperature causes convection such as air eddy in the space above the wafer mounted upon the base. When this convection comes in contact with the resist film formed upon the wafer or the developed wafer during heat processing, it may cause a development mark or unevenness in the thickness of the resist film, and decrease the yield rate.

An object of the present invention is to provide a heat processing method and a heat processing apparatus which makes the temperature distribution uniform in the space above the substrate while heat processing.

To solve the above-described problem, a first aspect of the present invention is a heat processing method composing the steps of mounting a substrate on a base disposed in a process container, heating the mounted substrate to a predetermined temperature with a heating means disposed inside the base, supplying a gas pre-heated to said predetermined temperature into the process container, and causing said heated gas to pass through a space above the mounted substrate.

A second aspect of the present invention is a heat processing apparatus for heating a substrate mounted on a base to a predetermined temperature with a heating means disposed inside the base, the base disposed in a process container, the apparatus comprising supplying section having a supply vent and supplying a gas into the process container through the supply vent, and means for pre-heating the gas to the predetermined temperature before supplying the gas into the process container, wherein the supply vent is disposed at one of the bottom and the side of the process container.

A third aspect of the present invention is a heat processing apparatus for heating a substrate mounted on a base to a predetermined temperature with a heating means disposed inside the base, the base disposed in a process container, the apparatus comprising, supplying section having a supply vent and supplying a gas into the process container through the supply vent, and means for pre-heating the gas to the predetermined temperature before supplying the gas into the process container, wherein the supply vent of is disposed around the base.

In the present invention, a gas pre-heated to a predetermined temperature is supplied to the process container, and the heated gas passes through a space above the mounted substrate.

Since the gas heated to a predetermined temperature passes through the space above the mounted substrate while heat processing, temperature distribution is kept uniform in the space above the substrate. Therefore, convection disturbing uniform temperature distribution is prevented, and the desired heat processing may be achieved.

These and other objects and profits of the invention can be easily defined by the following explanations and the accompanied drawings.

BRIEF DESCRIPTION OF THE DRAWINGS

FIG. 5 is a plan view of the composition of the pre-baking unit according to a preferred embodiment of the invention;

FIG. 6 is a perspective view of a rectifying board disposed in a rectifying path;

DETAILED DESCRIPTION OF THE INVENTION

Figure 1:
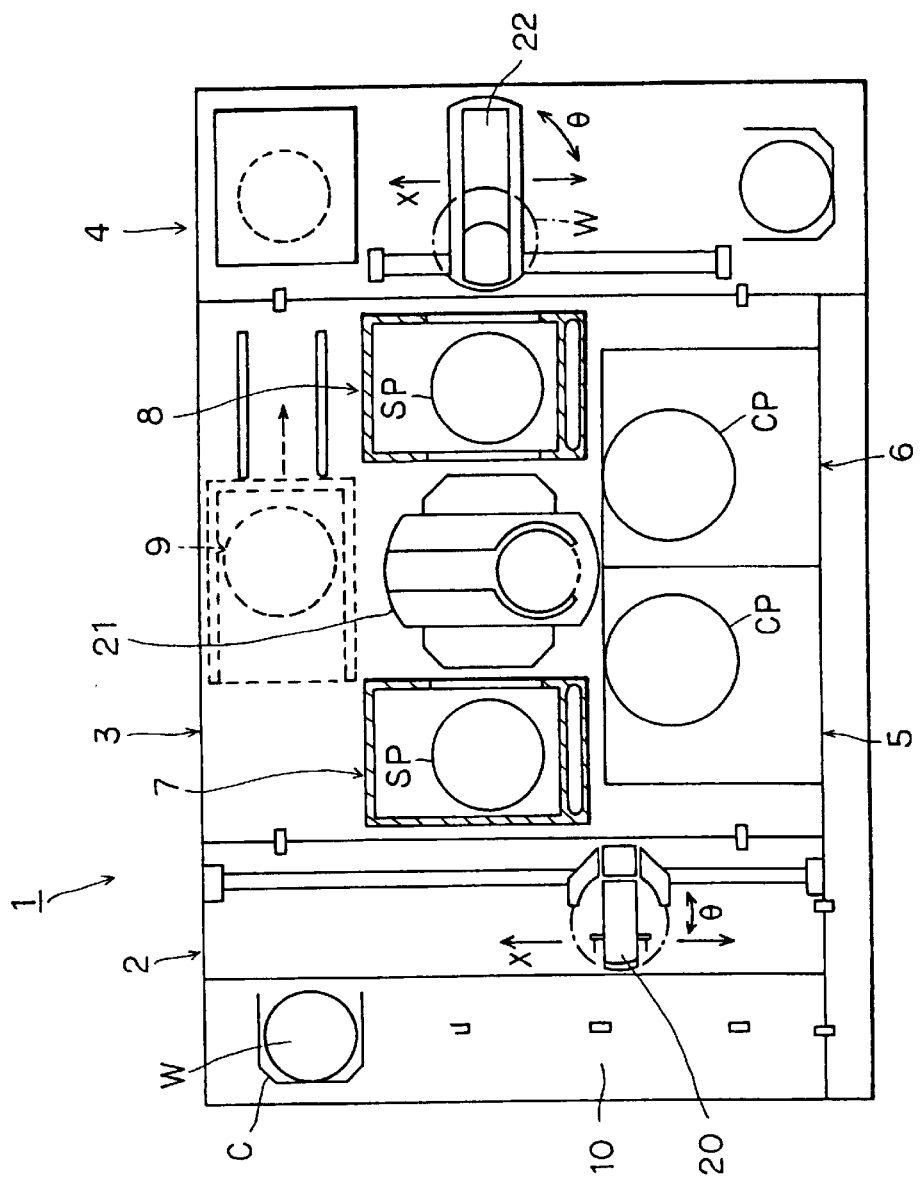
FIG. 1 is a plan view of a developing and coating system equipped with a pre-baking unit according to a preferred embodiment of the invention.

A preferred embodiment according to the present invention will be explained with reference to the accompanied drawings. The heat processing apparatus according to the preferred embodiment is a component of a coating and developing system. Therefore, this coating and developing system will be explained in advance. FIG. 1 is a plan view, FIG. 2 is a front view, and FIG. 3 is a rear view of this coating and developing system.

Figure 2:
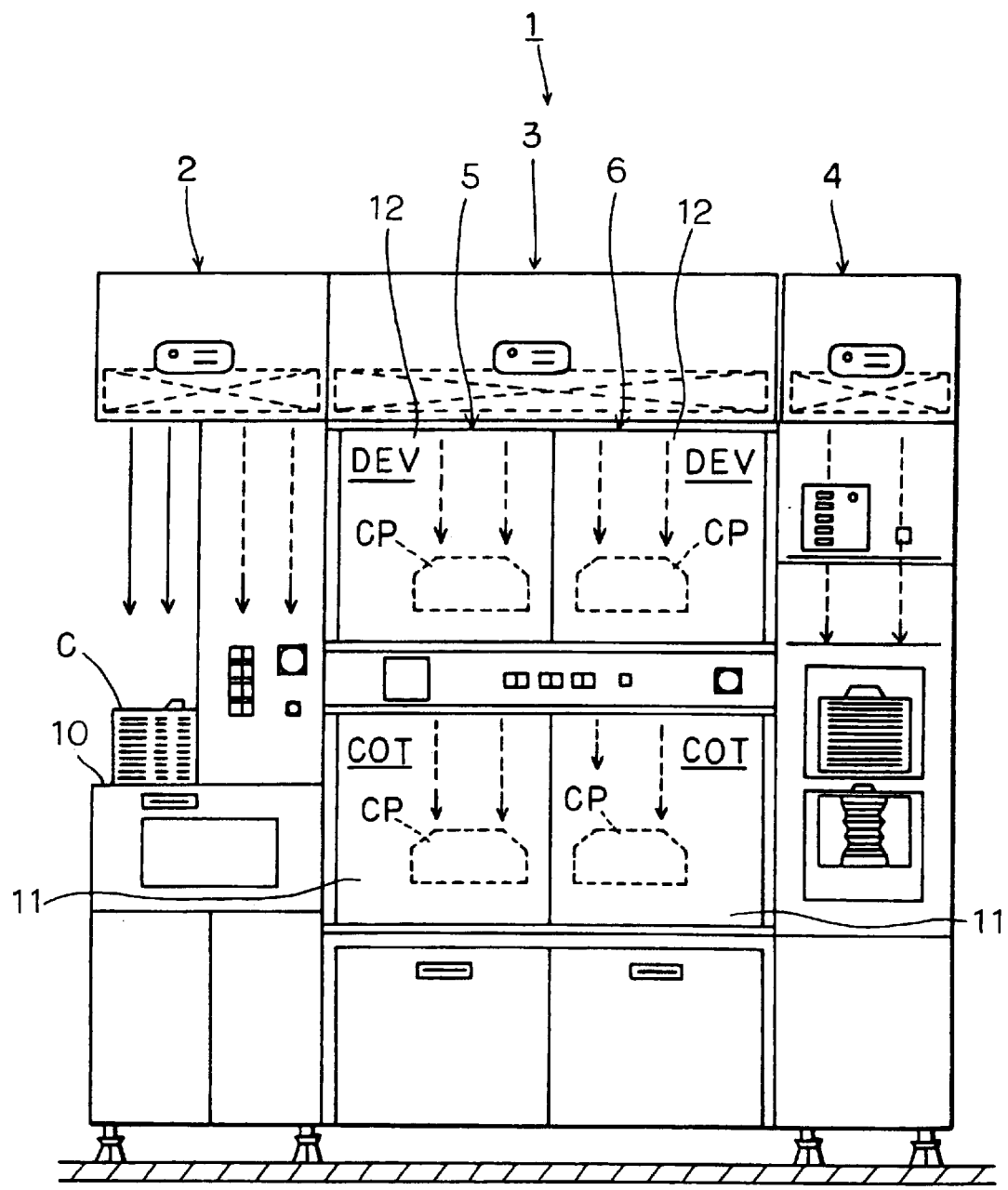
FIG. 2 is a front view of the developing and coating system shown in FIG. 1.
Figure 3:
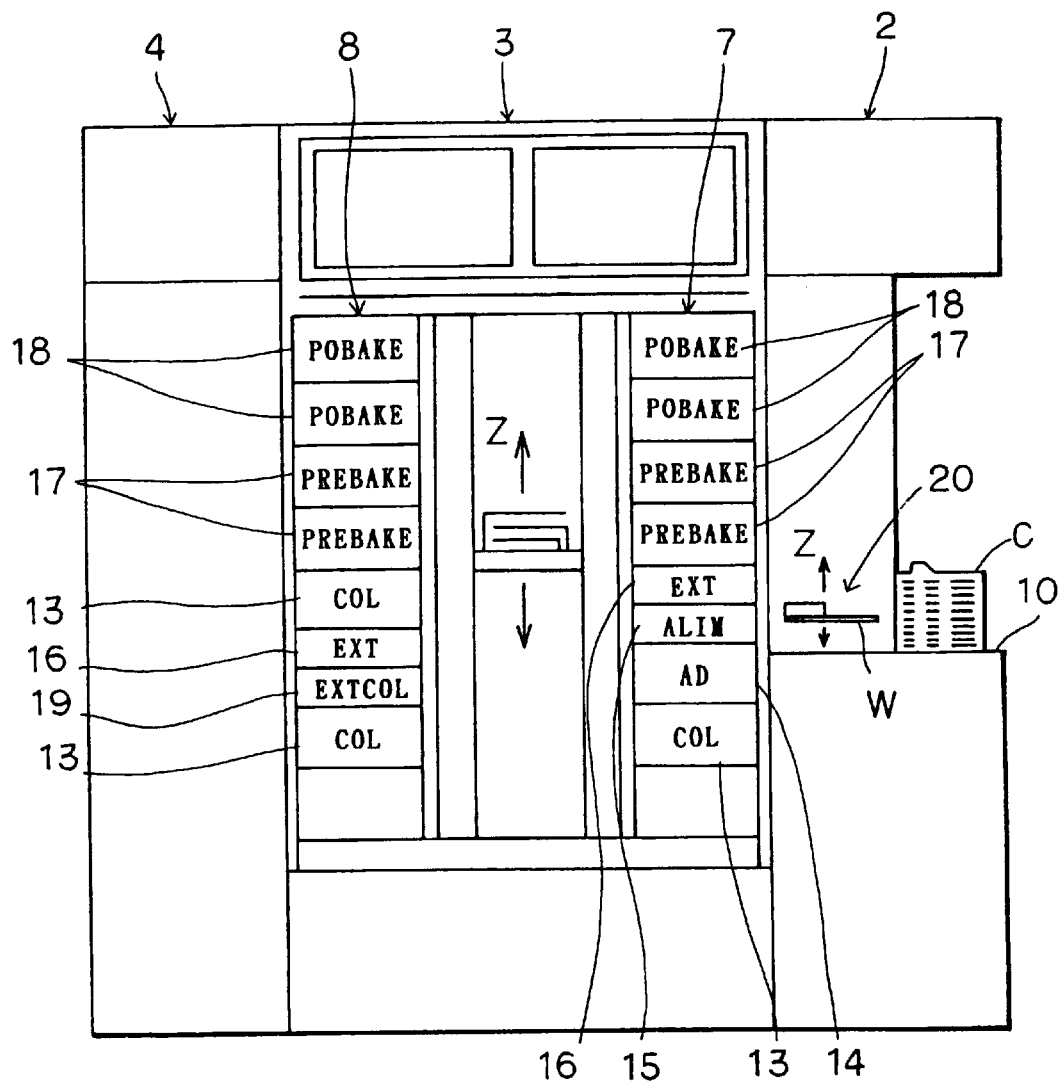
FIG. 3 is a rear view of the developing and coating system shown in FIG. 1.

As shown in FIGS. 1 and 2, the coating and developing system 1 has a cassette station 2 capable of mounting four cassettes C which can store a plurality of wafers W (25, for example). In this cassette station 2 is disposed a wafer transfer unit 20 for transferring a wafer W into and out of the cassette C or a third processing unit group 7 which will be mentioned later.

In the coating and developing system 1, there is a process station 3 for performing a predetermined process upon the wafer W. A main transfer unit 21 is disposed in the center of the process station 3. A first processing unit group 5 and a second processing unit group 6 are arranged on the front side of the coating and developing system 1. A third processing unit group 7 is arranged next to the cassette station 2. A fourth processing unit group 8 is arranged next to an interface section 4 which will be mentioned later. A fifth processing unit group 9 shown by a broken line is arranged in the rear.

In the first processing unit group 5 and the second processing unit group 6, a resist coating unit (COT) 11 and a developing unit (DEV) 12 are two-tiered from the bottom in order. The resist coating unit 11 coats a resist upon the wafer W inside a cup CP and the developing unit 12 develops the wafer W inside the cup CP. As shown in FIG. 3, eight units are multi-tiered in the third processing unit group 7. The units are, from the bottom in order, a cooling unit (COL) 13 for cooling, a hydrophobic processing unit (AD) 14 for improving the fixity between the resist and the wafer W, an alignment unit (ALIM) 15 for positioning the wafer W, an extension unit (EXT) 16 for keeping the wafer W on standby, two pre-baking units (PREBAKE) 17 and two post-baking units (POBAKE) 18. The baking units 17 and 18 are the heat processing apparatus of the embodiment. Eight units are multi-tiered in the fourth processing unit group 8. The units are, from the bottom in order, a cooling unit 13, an extension and cooling unit (EXTCOL) 19, an extension unit 16, another cooling unit 13, two pre-baking units 17 and two post-baking units 18. The arrangement of the units inside each processing unit groups may be changed freely according to the object and use of the developing and coating processes.

In the center of the interface section 4 next to the above processing station 3, there is a wafer transfer unit 22. The wafer transfer unit 22 transfers the wafer W to a wafer delivery table (not shown) on the exposure unit (not shown) side adjoining the interface section 4 or the fourth processing unit group 8.

Figure 4:
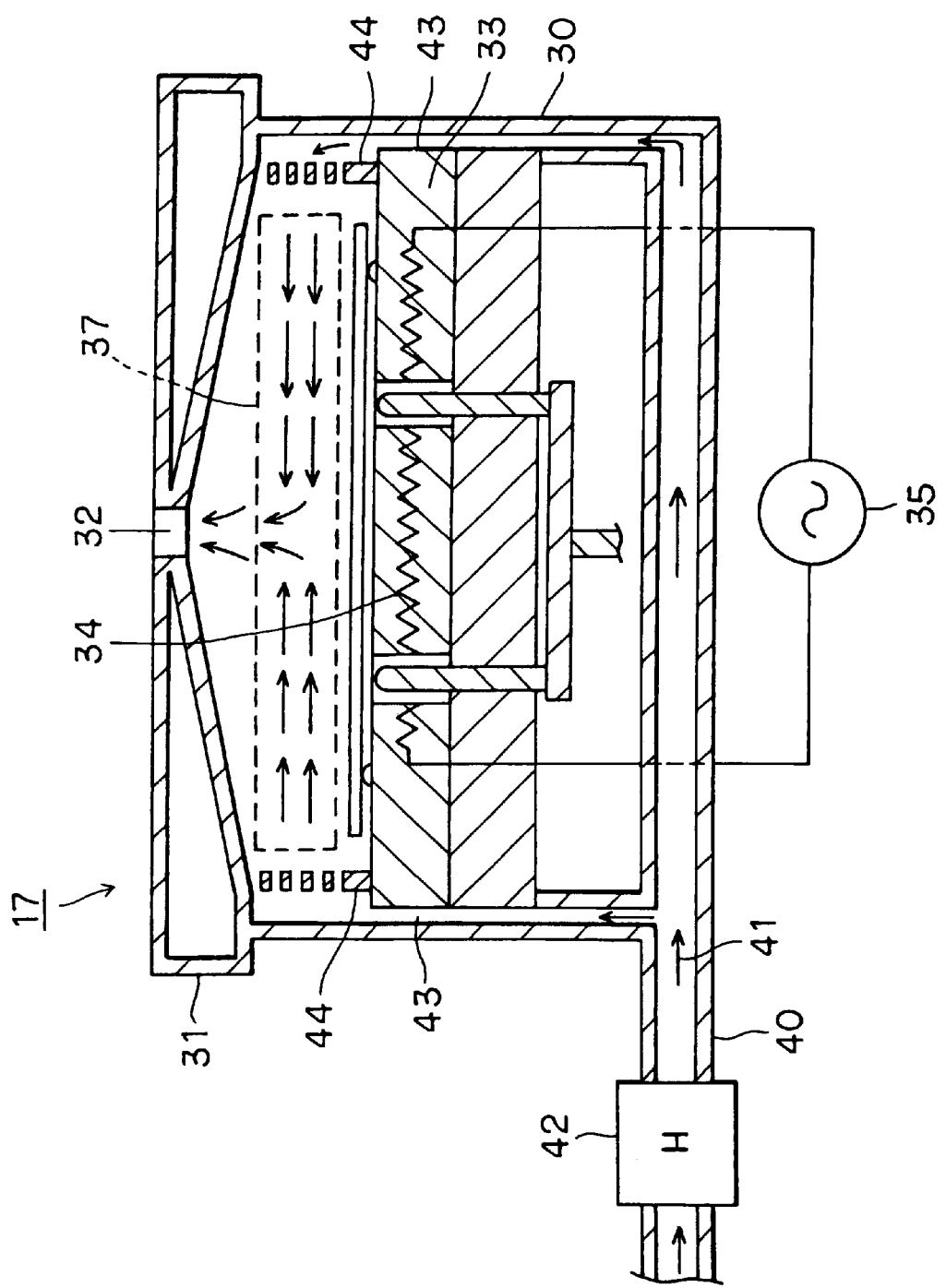
FIG. 4 is a cross-sectional view of the composition of a pre-baking unit according to a preferred embodiment of the invention.

Next, since both the pre-baking unit 17 and the post-baking unit 18 according to the embodiment have the same composition, the pre-baking unit 17 will be taken as an example for explanation. The pre-baking unit 17 performs heat processing to heat and remove the resist solution remaining on the surface of the wafer W after the resist coating process. FIG. 4 is a cross-sectional view and FIG. 5 is a plan view, both showing the composition of the pre-baking unit 17.

As shown in FIGS. 4 and 5, a process container 30 disposed inside the pre-baking unit 17 has an approximately cylindrical shape. The bottom portion of the upper member 31 of the process container 30 is slanted so as to guide the air inside the process container 30 effectively toward an exhaust port 32. A cylinder-shaped base 33 is disposed in the center of the process container 30. The base 33 mounts the wafer W with a predetermined gap in between. This gap is, for example, less than 5 mm and apart enough so that the wafer W and the base do not touch each other (when it is set more than 5 mm apart, a plurality of needless and unfavorable air eddy will generate in the space above the wafer W).

A heat generator 34 (such as a heat element) is buried inside the base 33, for heating the wafer W to a predetermined temperature of 120° C. The heat generator 34 heats the wafer W with electricity supplied from an AC power source 35 disposed outside the process container 30.

A gas supply pipe 40 is connected to the bottom of the process container 30. A heater 42 is inserted midway the gas supply pipe 40, for heating a gas 41. The heater 42 heats the gas 41 to 120° C., making the temperature of the gas 41 the same as the temperature of the wafer W heated by the heat generator 34. The gas supply pipe 40 communicates into the process container 30, through a supply vent 43 arranged in plural around the base 33. Around the edge of the base 33 is disposed a rectifying board 44, an approximately circular rectifying mechanism fixed vertical to the wafer W. Consequently, the rectifying board 44 is to be disposed near the supply vent 43.

As shown in FIG. 6, the rectifying board 44 has a plurality of rectifying paths 45 formed parallel to the wafer W and arranged regularly in lattice. Since the gas 41 passes through the rectifying board 44 through such a rectifying path 45, the gas 41 will be well and surely rectified to be parallel to the resist film (object surface to be processed) formed on the surface of the wafer W.

The post-baking unit 18 has the same composition as the pre-baking unit 17. It performs heat processing for heating and removing the remaining developing solution or the rinsing solution from the surface of the wafer W after development. The post-baking unit 18 also is composed so as to heat process the wafer W while circulating the gas pre-heated to 120° C. through the space above the wafer W.

Next, the operation of the pre-baking unit (PREBAKE) 17 composed in the above way will be explained corresponding to the coating and developing processes performed upon the wafer W in the coating and developing system 1. First, the wafer W taken out of the cassette C by the wafer transfer unit 20 is positioned in the alignment unit (ALIM) 15. The main transfer unit 21 receives the wafer W from the alignment unit 15, transfers it into the hydrophobic processing unit (AD) 14 for hydrophobic processing. The wafer W is cooled by the cooling unit (COL) 13 of the third processing unit group 7 or the fourth processing unit group 8. The wafer W is then transferred into a resist coating unit (COT) 11 of the first processing unit group 5 or the second group 6 for resist coating. Heat processing is performed after that in a pre-baking unit (PREBAKE) 17 of the third processing unit group 7 or the fourth group 8.

Now, the heat processing performed by the pre-baking unit 17 will be explained. As shown in FIG. 4, electricity is supplied to the heat generator 34 in the process container 30, heating the wafer W to the predetermined temperature of 120° C. and removing the resist solution remaining upon the wafer W. To perform the heat processing well, it is important to keep the temperature distribution uniform in the upper space 37 above the wafer W in the air inside the process container 30 and to prevent convection which disturbs uniform temperature distribution.

So, according to the embodiment of the invention, the gas 41 supplied into the process container 30 is pre-heated by the heater 42. The gas 41 is rectified by the rectifying board 44 to be parallel to the resist film (object surface to be processed) formed upon the wafer W, just before it flows into the center of the process container 30 through the supply vent 43. Thus, the gas 41 heated to 120° C. will pass through the upper space 37 above the wafer W, enabling uniform temperature distribution in the upper space 37. Therefore, generation of convection which disturbs uniform temperature distribution in the upper space 37 may be prevented.

The gas 41 flowing into the center of the process container is exhausted from the exhaust port 32. Meanwhile, the gas 41 passes parallel to the resist film, improving the uniformity of temperature distribution in the upper space 37 above the wafer W. Therefore, unevenness in the thickness of the resist film is prevented, achieving a desired heat processing.

After the above processes, the wafer W is cooled in the extension and cooling unit (EXTCOL) 19 and is mounted inside the extension unit (EXT) 16 of the fourth processing group 8. A wafer transfer unit 22 is introduced from the rear to transfer the wafer W to an exposure unit (not shown) side. After exposure, the wafer W is transferred again to the extension unit 16 of the fourth processing group 8, to be handed over to the main transfer unit 21. The wafer W is transferred into the developing unit (DEV) 12 of the first processing group 5 or the second processing group 6, for development. The wafer W is heated by the post-baking unit (POBAKE) 18 of the third processing group 7 or the fourth processing group 8. The wafer W is then cooled by the cooling unit 13 of the third processing group 5 or the fourth processing group 6, finishing the entire series of developing and coating processes.

The same heat processing steps as the aforementioned pre-baking unit 17 is performed in the post-baking unit 18, achieving reliable heat processing. Also when performing a dehydration baking or a PEB process corresponding to the purpose of the developing and coating processes, the above heat processing will also be properly performed.

Thus, according to the pre-baking unit 17 of the present invention, since the gas 41 pre-heated to 120° C. passes parallel to the surface of the wafer W in the upper space 37 above the wafer W during heat processing, generation of convection disturbing uniform temperature distribution in the upper space 37 is suppressed, preventing mal-processing. Therefore, desired heat processing is achieved.

Figure 7:
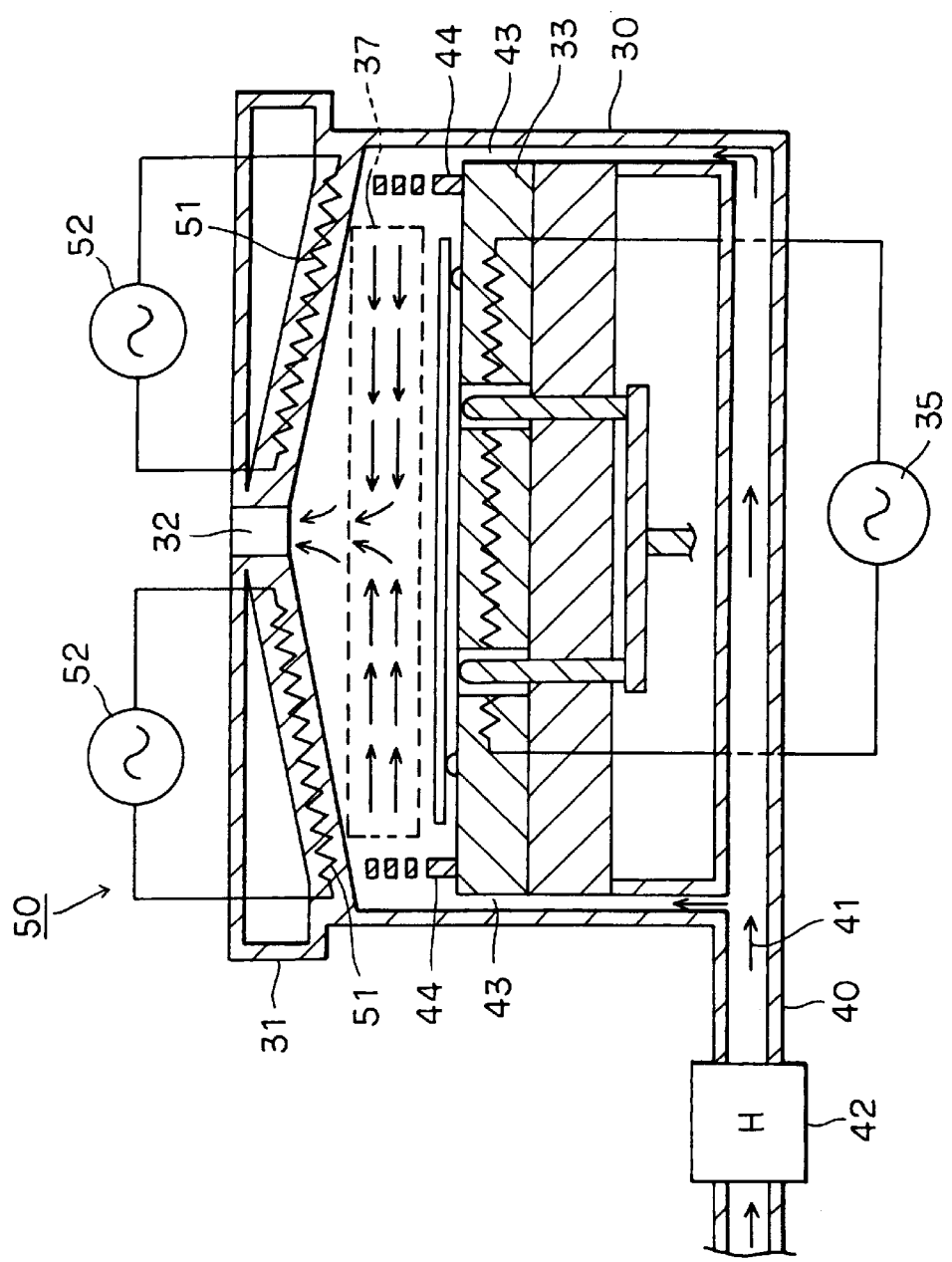
FIG. 7 is a cross-sectional view of the composition of a pre-baking unit according to a second embodiment of the invention.

Next, there will be explained a second embodiment of the invention, with a temperature adjusting mechanism for adjusting the temperature of the space above the wafer W to 120° C. FIG. 7 is a cross-sectional view of the composition of a pre-baking unit 50 according to the second embodiment. As shown in FIG. 7, a heat generator 51 is buried inside the upper member 31 of the process container 30 as a temperature adjusting mechanism. When electricity is supplied from an AC power source 52, the heat generator 51 generates heat, heating the upper space 37 above the wafer W to 120° C. Besides the heat generator 51 being buried inside the upper member 31, the composition of the second embodiment is the same as the aforementioned pre-baking unit 17, so the components having the same function and composition as the first embodiment will have the same numerals and symbols, and explanation will not be repeated.

With such a composition, the temperature in the upper space 37 above the wafer w will be uniformly adjusted to 120° C. while circulating the gas 41 during heat processing. Thus, the temperature distribution in the upper space 37 above the wafer W will be more surely made uniform. Convection is suppressed and mal-processing is effectively prevented.

Figure 8:
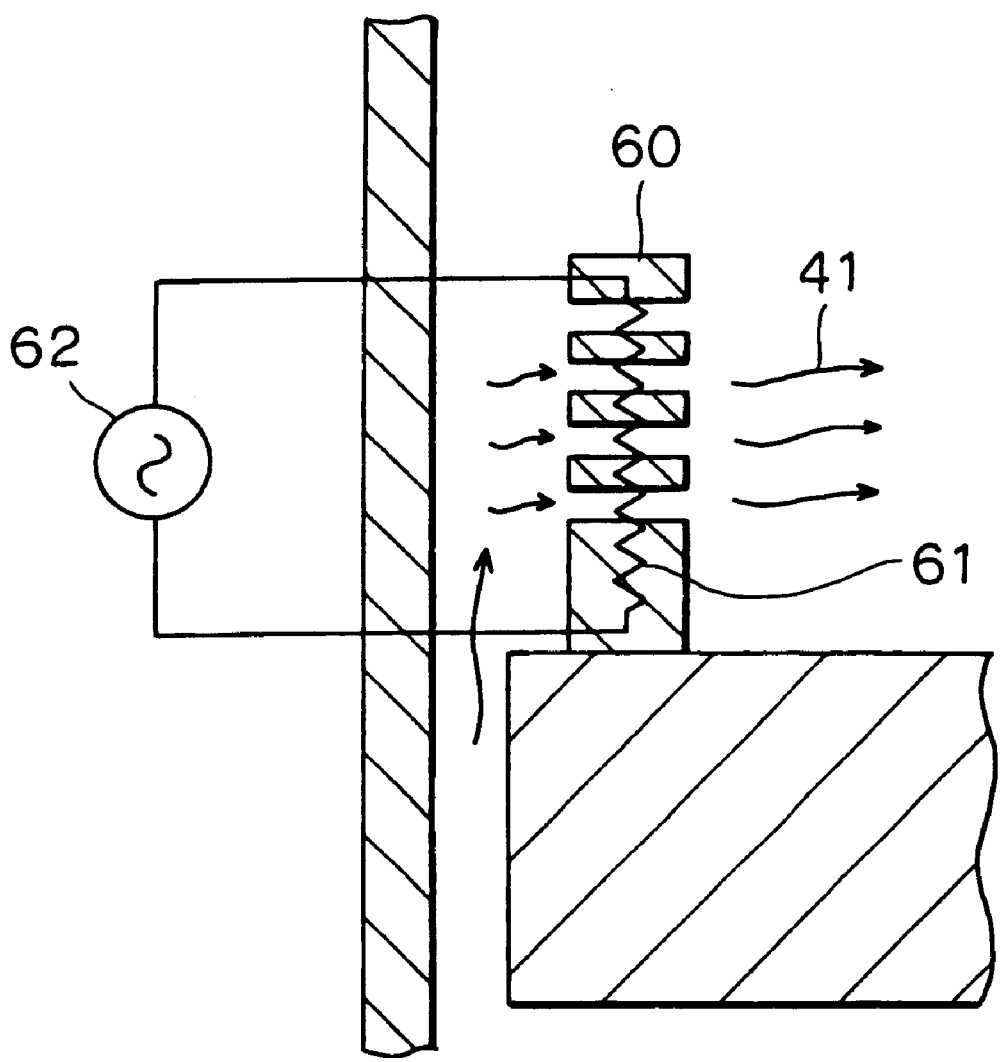
FIG. 8 is a cross-sectional view of a rectifying board buried in a heat generator.

Heating function may be added to the rectifying board. Instead of inserting the heater 42 in the gas supply pipe 40, a heat generator 61 may be buried in a rectifying board 60 as shown in FIG. 8. When electricity is supplied from an AC power source 62, the heat generator 61 generates heat and the rectifying board 60 heats the gas 41.

With such a composition, the rectifying board 60 not only rectifies the gas 41 but also heats the gas 41, simplifying the apparatus. Or, the gas 41 may be heated twice, with the heater 42 and the rectifying board 60. In this case, the gas 41 once heated by the heater 42 is heated again by the rectifying board 60. Therefore, even if the temperature of the gas 41 falls down before entering the process container 30, it is heated again and the gas kept at 120° C. passs through the upper space 37 above the wafer W.

Figure 9A:
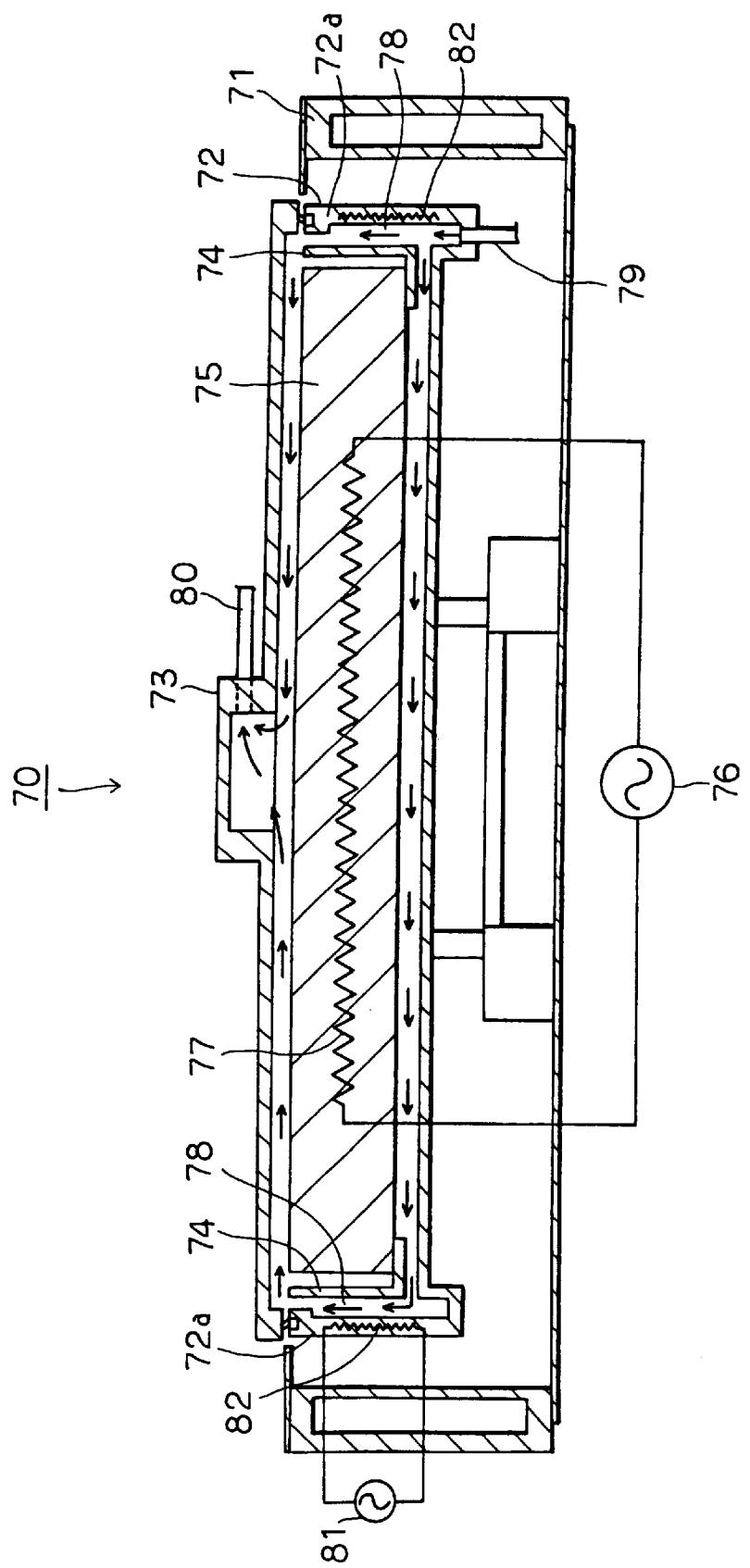
FIG. 9A is a cross-sectional view of the composition of a pre-baking unit according to a third embodiment of the invention.

Next, there will be explained a third embodiment of the invention, without a rectifying board and with a heat generator buried inside the side wall of the process container. FIG. 9A is a cross-sectional view of the composition of a pre-baking unit 70 according to the third embodiment. First, the composition of the pre-baking unit 70 will be explained. As shown in FIG. 9A, a process container 72 is disposed inside an outer casing 71. The top opening of the process container 72 is covered by a lid 73, sealing the air inside the process container 72. Inside the process container 72, there is a base 75 supported by a supporting member74. Inside the base 75 is buried a heat generator 77 heated by an AC power source 76.

At the bottom of the process container 72 is connected a gas supply pipe 79 supplying a gas 78 pre-heated to 120° C. by a heater (not shown). The gas 78 supplied through the gas supply pipe 79 flows from the bottom part of the process container 72 up along and between a side wall 72a of the process container 72 and a supporting member 74. Then, the gas 78 flows above the base 75 and exhausts outside the pre-baking unit 70 through an exhaust pipe 80 connected to the lid 73. Inside the side wall 72a of the process container 72 is buried a heat generator 82 heated by an AC power source 81. When electricity from the AC power source 81 is supplied, the heat generator 82 heats the air near the side wall 72a to 120° C.

Figure 9B:
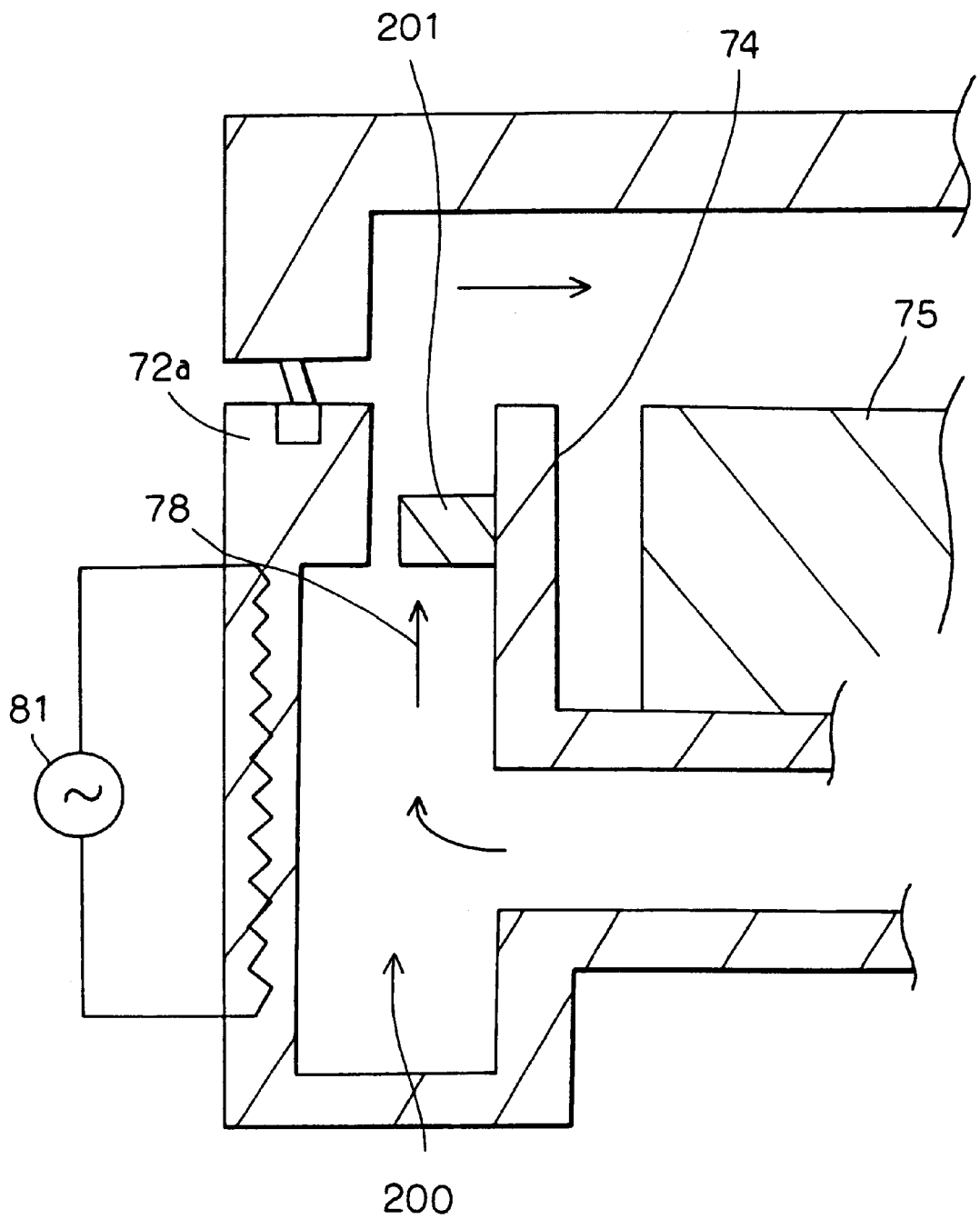
FIG. 9B is a cross-sectional view explaining the principal parts of FIG. 9A.

In addition, as shown in FIG. 9B, a gas pool forming member 201 forming a gas pool 200 is disposed in the supporting member 74 between the supporting member 74 and the side wall 72a. The gas pool forming member 201 is composed to heat the gas 78 fully. Therefore, the temperature of the gas 78 becomes uniform, enabling satisfactory heat processing upon the wafer W.

In the above composition, as with the aforementioned case of the rectifying board having a heating function, the gas 78 whose temperature became lower than 120° C. can be heated again while flowing up along the side wall 72a of the process container 72. Therefore, the gas 78 kept at 120° C. passs above the base 75 and satisfactory heat processing is performed upon the wafer W mounted on the base 75.

Figure 10:
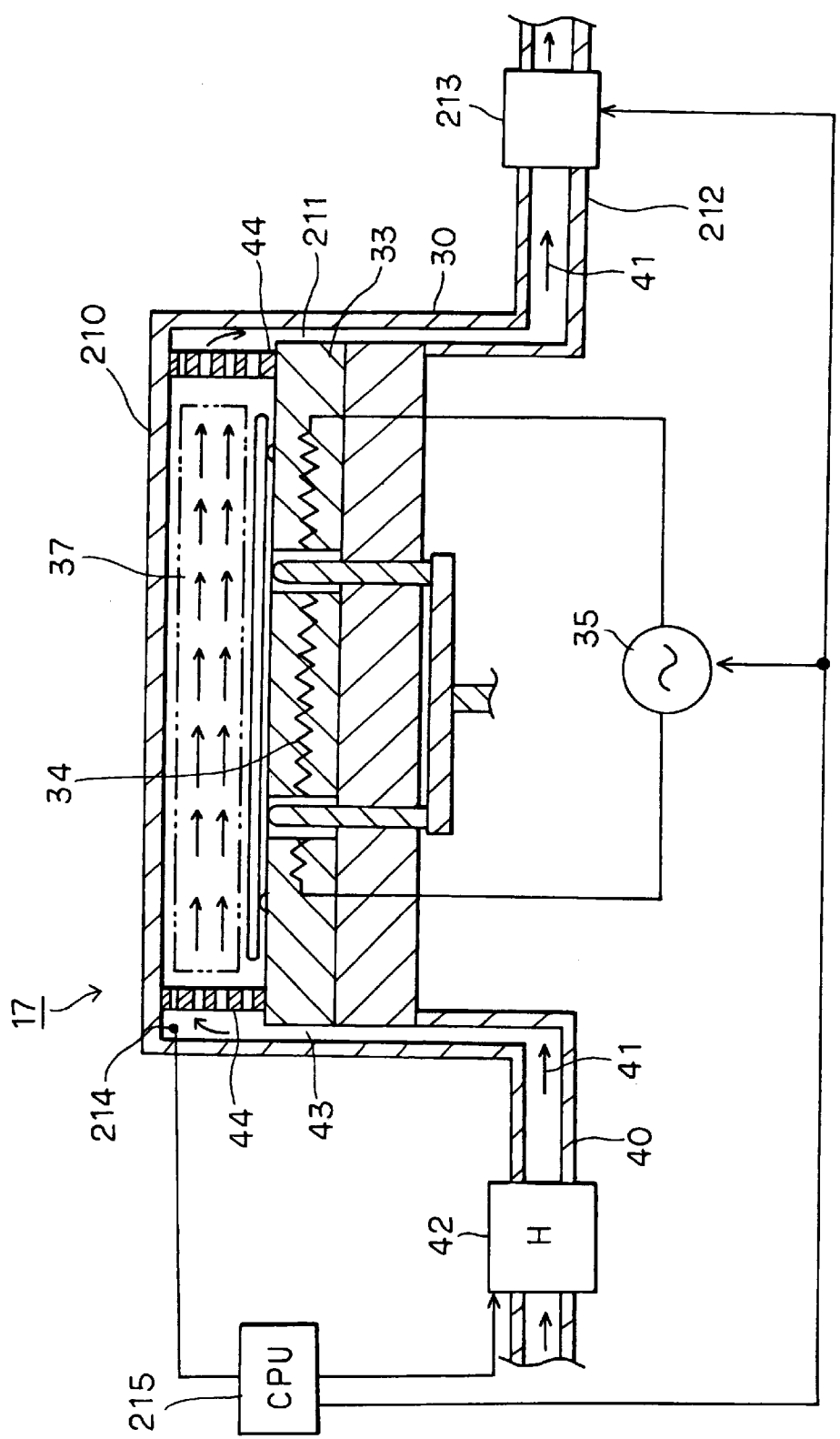
FIG. 10 is a cross-sectional view of the composition of a pre-baking unit according to a fourth embodiment of the invention.

Next, there will be explained a fourth embodiment of the invention, with a mechanism for forming a horizontal flow of air in the space above the wafer W. FIG. 10 is a cross-sectional view of the composition of a pre-baking unit 17 according to the fourth embodiment. The composition of the pre-baking unit 17 will be explained first. As shown in FIG. 10, an upper member 210 of the process container 30 is composed flat. There is no exhaust port 32 aforementioned to exhaust the gas 41 in the upper member 210. The gas 41 is supplied only from one side of the wafer W (the left side in the drawing). The gas 41 supplied to the space above the wafer W is exhausted from the other side of the wafer W (the right side in the drawing). This exhausting mechanism exhausts the gas 41 through the rectifying board 44, out from an exhaust port 211, and through an exhaust pipe 212 as an exhaust path. In midway of the exhaust path, there is an exhaust amount adjusting mechanism, such as a butterfly valve 213, for adjusting the amount of exhaust.

Also near the rectifying board 44 on the supply side of the gas 41, there is a temperature detector, such as a temperature sensor 214, to see if the supplied gas 41 has the desired temperature. The data detected by the temperature sensor 214 is judged by a controlling mechanism, such as a CPU 215, for controlling the heater 42 based on this judgement. The CPU 215 also controls the AC power source 35 and the butterfly valve 213 to obtain the desired conditions.

The components having the same function and composition as the pre-baking unit 17 explained before will have the same numerals and symbols, and explanation will not be repeated.

With such a composition, it is possible to cause the gas 41 to pass during heat processing from one end to the other, keeping the gas 41 more horizontal. Therefore, unneeded convection such as air eddy is suppressed in the space above the wafer W, and the upper space 37 above the wafer W is kept uniformly at 120° C. Thus, temperature distribution in the upper space 37 above the wafer W is more certainly kept uniform. Convection is suppressed and mal-processing is effectively prevented.

Figure 11:
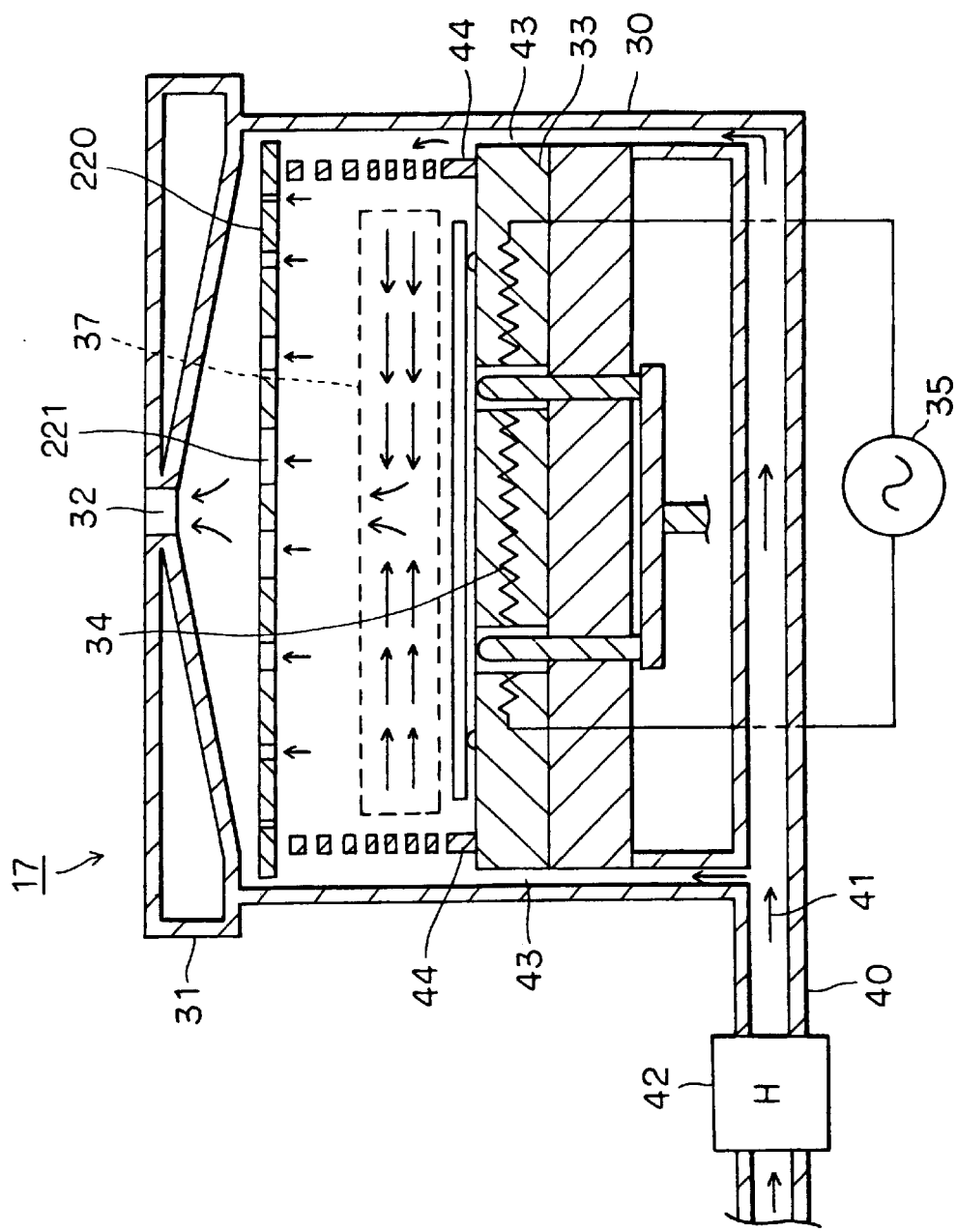
FIG. 11 is a cross-sectional view of the composition of a pre-baking unit according to a fifth embodiment of the invention.

Next, there will be explained a fifth embodiment, with a rectifying board above the wafer W. FIG. 11 is a cross-sectional view of the composition of the pre-baking unit 17 according to the fifth embodiment. For example, as shown in this FIG. 11, a rectifying board 220 is disposed above the wafer W. A plurality of holes or pores 221 are dispersed in the rectifying board 220. The diameter of the pore 221 increases as the pore 221 approaches the center of the rectifying board 220. Since the fifth embodiment has the same composition as the pre-baking unit 17 explained before, the components having the same function and composition will have the same numerals and symbols, and explanation will not be repeated.

With such a composition, the rectifying board 220 moderates concentrated exhaustion from the exhaust port 32 above the wafer W. Therefore, uneven distribution of pressure or needless disturbance in air current such as an air eddy in the upper space 37 above the wafer W may be suppressed, adjusting temperature uniformly at 120° C. in the upper space 37 above the wafer W. Thus, the temperature distribution in the upper space 37 above the wafer w is more certainly kept uniform, suppressing convection and effectively preventing mal-processing.

Needless to say, although the diameter of the pore 221 has been set to increase as the pore 221 approaches the center in this embodiment, the diameter may also decrease as it gets near the center. Or, it may be set unevenly with scarce and crowded areas. For example, the pores may be crowded near the edge and the center of the rectifying board.

Figure 12:
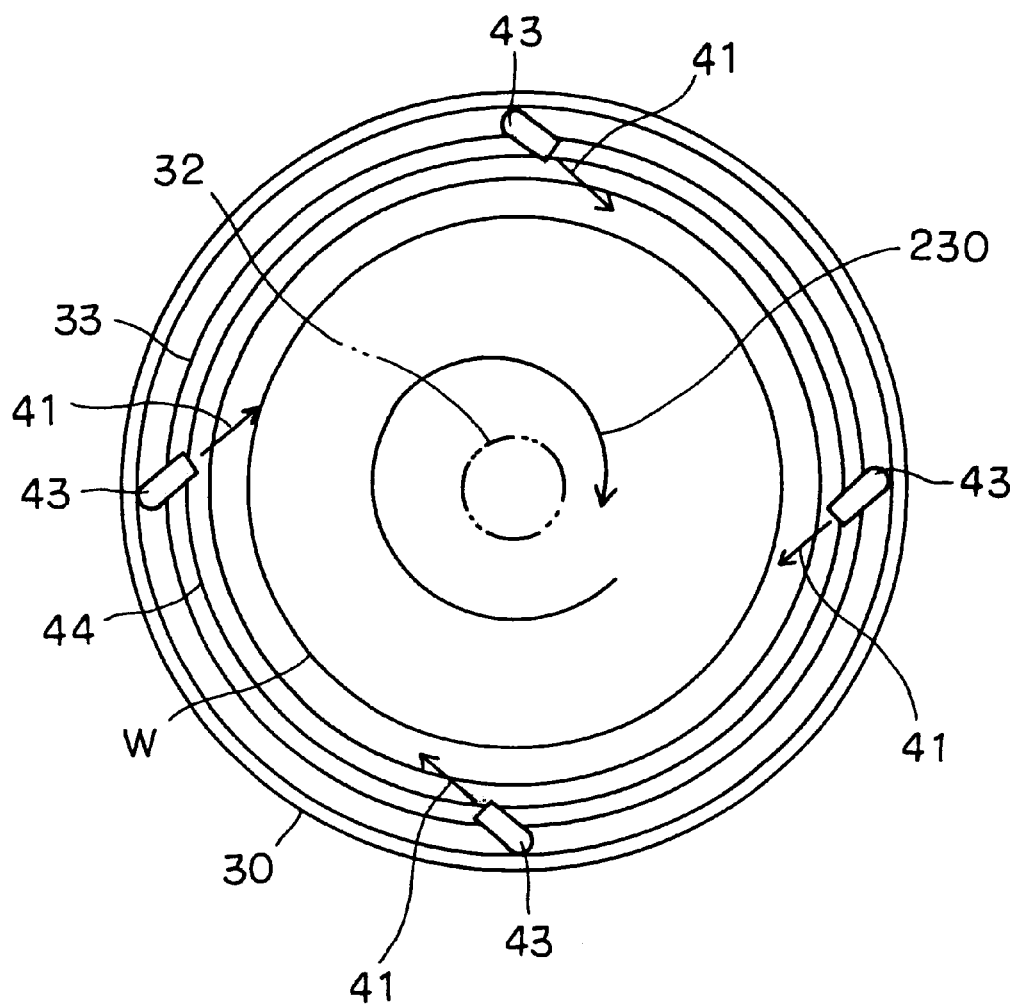
FIG. 12 is a plan view of the composition of a pre-baking unit according to a sixth embodiment of the invention.

Next, there will be explained a sixth embodiment, with a rectifying board above the wafer W. FIG. 12 explains another embodiment of a supply vent 43 disposed in plural around the base 33 according to FIG. 5, a plan view of the composition of the pre-baking unit. Each supply vent 43 in FIG. 12 blows the gas 41 in the same direction with a predetermined angle. The gas 41 blown from each supply vent 43 forms a flow of gas circulating in one direction above the wafer W.

Therefore, by forming a flow of gas circulating in one direction in the upper space 37 above the wafer W, the uniformity of heat upon the wafer W increases, convection disturbance such as an unneeded air eddy is suppressed, and the temperature in the upper space 37 above the wafer W is adjusted uniformly at 120° C. Thus, the temperature distribution in the upper space 37 above the wafer W is more securely kept uniform, suppressing convection and effectively preventing mal-processing.

Needless to say, the present invention is not intended to be limited to the above-described embodiments, and various changes may be made therein. For example, the gas supply pipe 40 may be connected to the side of the process container 30. The gas 41 circulating in parallel to the surface of the wafer W is more easily supplied into the process container 30. The substrate is not to be limited to the above wafer W. It may also be an LCD substrate, a glass substrate, a CD substrate, a photo-mask, a printed circuit board, a ceramic substrate, and so forth.

The above-described embodiments are strictly intended to bring the technical contents of the present invention into focus. Therefore, the present invention should not be interpreted in a narrow sense by limiting to such a concrete example, but it is applicable in various forms within the range of the spirit of the present invention and the extent described in the claims.

What is claimed is:

1. A heat processing method comprising the steps of:
   mounting a substrate on a base disposed in a process container; heating the mounted substrate to a predetermined temperature with a heater disposed inside the base; supplying a gas pre-heated to said predetermined temperature into the process container; and causing said heated gas to pass through a space above the mounted substrate,
   wherein the mounted substrate and the base are spaced apart so that the substrate and the base do not contact each other, and the mounted substrate and the base are separated by less than 5 mm.

2. The heat processing method according to claim 1, wherein said heated gas passes through the space so that a passage of the heated gas is parallel to a surface of the mounted substrate.

3. The heat processing method according to claim 1, wherein said heated gas passes through the space so that a passage of the heated gas is parallel to a surface of the mounted substrate from one end of the mounted substrate to the other end of the mounted substrate.

4. The heat processing method according to claim 1, wherein the temperature of said heated gas is approximately the same as the temperature of the base.

5. A heat processing apparatus that heats a substrate mounted on a base to a predetermined temperature with a heater disposed inside the base, the base disposed in a process container, the apparatus comprising:
   a supplier having a supply vent that supplies a gas into the process container through the supply vent;
   a second heater that pre-heats the gas to the predetermined temperature before the gas is supplied into the process container,
   wherein the supply vent is disposed at one of the bottom and the side of the process container, and
   wherein the mounted substrate and the base are spaced apart so that the substrate and the base do not contact each others and the mounted substrate and the base are separated by less than 5 mm.

6. The heat processing apparatus according to claim 5, comprising a rectifying mechanism disposed near the supply vent.

7. The heat processing apparatus according to claim 6, comprising:
- a rectifying mechanism is supported so as to be vertical to the surface of the mounted substrate; and
- a rectifying path provided in the rectifying mechanism being formed so as to be parallel to the surface of the mounted substrate.

8. The heat processing apparatus according to claim 7, wherein said rectifying mechanism is said second heater.

9. The heat processing apparatus according to claim 8, wherein the apparatus further comprises a temperature adjuster in the space above the mounted substrate that adjusts the temperature to the predetermined temperature.

10. The heat processing apparatus according to claim 5, the apparatus further comprises an exhaust that vents a gas supplied by said supplier to one of the upper side and the side of the process container.

11. The heat processing apparatus according to claim 5, further comprising:
- an exhaust disposed on the upper side of the process container that exhausts a gas supplied by the supplier; and
- a rectifying mechanism disposed between the exhaust and the base.

12. A heat processing apparatus that heats a substrate mounted on a base to a predetermined temperature with a heater disposed inside the base, the base disposed in a process container, the apparatus comprising:
- a supplier having a supply vent that supplies a gas into the process container through the supply vent; and
- a second heater that pre-heats the gas to the predetermined temperature before the gas is supplied into the process container,
- wherein the supply vent is disposed around the base, and
- wherein the mounted substrate and the base are spaced apart so that the substrate and the base do not contact each other, and the mounted substrate and the base are separated by less than 5 mm.

13. The heat processing apparatus according to claim 12, comprising a rectifying mechanism disposed near the supply vent.

14. The heat processing apparatus according to claim 13, comprising:
- a rectifying mechanism supported so as to be vertical to the surface of the mounted substrate; and
- a rectifying path provided in the rectifying mechanism being formed so as to be parallel to the object surface of the mounted substrate.

15. The heat processing apparatus according to claim 14, wherein said rectifying mechanism is said second heater.

16. The heat processing apparatus according to claim 15, comprising a temperature adjuster in the space above the mounted substrate that adjusts the temperature to the predetermined temperature.

17. The heat processing apparatus according to claim 12, further comprising an exhaust that vents the gas supplied by the supplier to one of the upper side and the side of the process container.

18. The heat processing apparatus according to claim 12, further comprising:
- an exhaust disposed on the upper side of the process container that vents the gas supplied by the supplier; and
- a rectifying mechanism disposed between the exhaust and the base.

19. A heat processing method comprising the steps of:
- mounting a substrate on a base disposed in a process container; heating the mounted substrate to a predetermined temperature with a heater disposed inside the base; supplying a gas pre-heated to said predetermined temperature into the process container; and causing said heated gas to pass through a space above the mounted substrate,
- wherein the temperature of said heated gas is approximately the same as the temperature of the base.

20. A heat processing apparatus that heats a substrate mounted on a base to a predetermined temperature with a heater disposed inside the base, the base disposed in a process container, the apparatus comprising:
- a supplier having a supply vent that supplies a gas into the process container through the supply vent; and
- a second heater that pre-heats the gas to the predetermined temperature before the gas is supplied into the process container,
- wherein the supply vent is disposed at one of the bottom and the side of the process container, and
- wherein the temperature of said heated gas is approximately the same as the temperature of the base.

21. A heat processing apparatus that heats a substrate mounted on a base to a predetermined temperature with a heater disposed inside the base, the base disposed in a process container, the apparatus comprising:
- a supplier having a supply vent that supplies a gas into the process container through the supply vent; and
- a second heater that pre-heats the gas to the predetermined temperature before the gas is supplied into the process container,
- wherein the supply vent of is disposed around the base, and
- wherein the temperature of said heated gas is approximately the same as the temperature of the base.

* * * * *